United States Patent [19]

Terry et al.

[11] Patent Number: 5,141,889
[45] Date of Patent: Aug. 25, 1992

[54] METHOD OF MAKING ENHANCED INSULATED GATE BIPOLAR TRANSISTOR

[75] Inventors: Lewis E. Terry, Phoenix; Stephen P. Robb; Robert E. Rutter, both of Tempe, all of Ariz.

[73] Assignee: Motorola, Inc., Schaumburg, Ill.

[21] Appl. No.: 715,864

[22] Filed: Jun. 17, 1991

Related U.S. Application Data

[62] Division of Ser. No. 620,124, Nov. 30, 1990, abandoned.

[51] Int. Cl.⁵ .................. H01L 21/265; H01L 21/328
[52] U.S. Cl. ........................... 437/31; 437/26; 437/29; 437/40; 437/50; 437/228; 148/DIG. 126
[58] Field of Search .......................... 357/37, 34, 23.4; 437/26, 27, 29, 31, 40, 41; 148/DIG. 126

[56] References Cited

U.S. PATENT DOCUMENTS

| | | | |
|---|---|---|---|
| 4,638,552 | 1/1987 | Shimbo et al. | 437/31 |
| 4,782,379 | 11/1988 | Baliga | 357/23.4 |
| 4,837,177 | 6/1989 | Lesk et al. | 437/31 |
| 4,841,345 | 6/1989 | Majumdar | 357/23.4 |
| 4,972,239 | 11/1990 | Mihara | 357/91 |
| 5,023,696 | 6/1991 | Ogino | 357/38 |

FOREIGN PATENT DOCUMENTS

| | | |
|---|---|---|
| 3628857 | 3/1987 | Fed. Rep. of Germany |
| 0126668 | 6/1987 | Japan |
| 0080077 | 3/1989 | Japan |
| 0209766 | 8/1989 | Japan |

OTHER PUBLICATIONS

Akiyama et al., "A Collector Shorted Type Insulated Gate Bipolar Transistor", PCIM'88 Proc., pp. 142–151, 1988.

Akiyama et al., "Effects of Shorted Collector on Characteristics of IGBTS", Proc. of 1990 Int. Symp. on Power Semicond. Devices and ICs, pp. 131–136, 1990.

Akeyama et al., "Novel Low-Loss and High Speed Diode Utilizing an Ideal Ohmic Contact", IEEE Trans. on Electron Devices, ED-29, No. 2, Feb. 1982.

Sin, J. et al.; "Conductivity Modulation Effect in High Voltage N-Channel Schottky Injection FETs", Electrochemical Society Proceedings of the Symposium on High Voltage and Smart Power IC's; vol. 89-15, 1989.

Primary Examiner—Tom Thomas
Attorney, Agent, or Firm—Stuart T. Langley

[57] ABSTRACT

An insulated gate bipolar device is formed on a multiple conductivity substrate. The multiple conductivity substrate comprises interspersed regions of N+ and P+ semiconductor material. In a preferred embodiment, the N+ and P+ regions are arranged in a checkerboard, mosaic pattern on a bottom side of the substrate. The P+ region serves to conductivity modulate an N epitaxial layer in which the IGBT structure is formed while the N+ regions improve low current conductivity, reduce minority carrier recombination time, and make an integral drain source diode accessible from the drain and source electrodes.

6 Claims, 3 Drawing Sheets

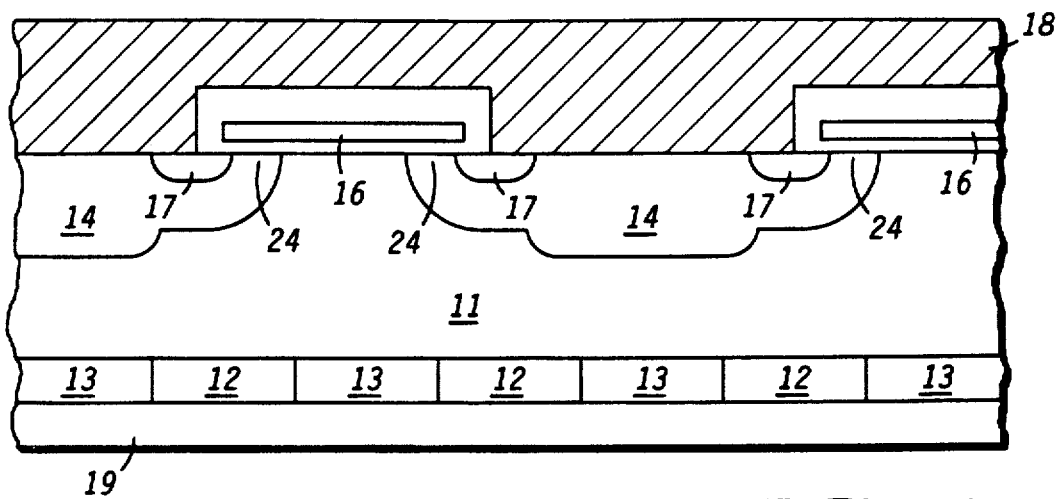
FIG. 1
FIG. 2
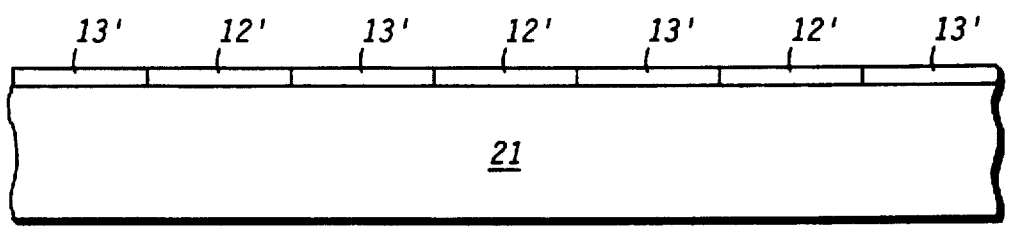
FIG. 3
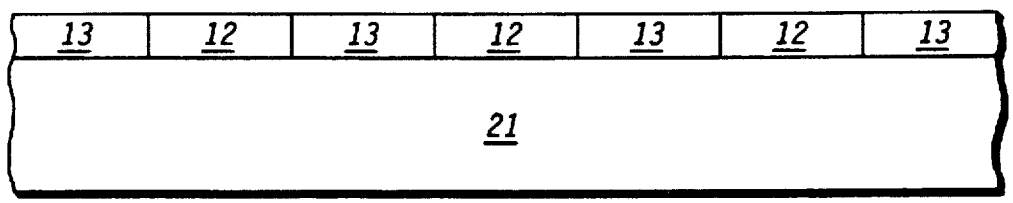
FIG. 4
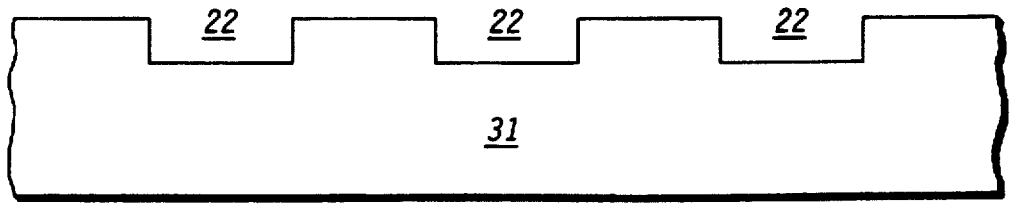

METHOD OF MAKING ENHANCED INSULATED GATE BIPOLAR TRANSISTOR

This application is a division of prior application Ser. No. 07/620,124, filed on Nov. 30, 1990, now abandoned.

BACKGROUND OF THE INVENTION

The present invention relates in general to insulated gate bipolar transistors, and more particularly, to an insulated gate bipolar transistor with enhanced ON resistance in switching performance.

Recently, a class of power semiconductor devices, which is a hybrid of metal oxide semiconductor (MOS) and bipolar power technologies, has evolved. These hybrid devices are commonly known as insulated gate bipolar transistors (IGBTs) or insulate gate transistors (IGTs). IGBTs combine low drive current advantage and fast turn-on times of power MOS devices with the high current and high voltage characteristics of bipolar devices. Because of their superior characteristics for low and medium frequency applications, when compared with bipolar transistors and power MOSFETs, a substantial amount of work has been undertaken to obtain a good understanding of the operating characteristics. A vigorous effort has been underway in the industry to improve power ratings by increasing both current and voltage handling capability. Further, an intense effort has been directed at reducing turn-off time of IGBTs which has severely limited their use in high frequency applications.

A conventional IGBT comprises a power MOS structure such as a diffused MOS (DMOS) device formed in an N epitaxial layer. In a conventional MOS device, the N epitaxial layer is formed on an N-type substrate. In contrast, the N epitaxial layer formed on a P+ substrate for an IGBT. Although slight modifications must be made to the device elements formed in the epitaxial layer, the primary difference between the conventional MOS and an IGBT is that an IGBT uses a P-type substrate rather than an N-type substrate. The P-type substrate injects minority carriers into the N epitaxial layer when the IGBT is in forward conduction mode, thereby increasing conductivity in the N-type epitaxial region.

One disadvantage of conventional IGBT structures is that minority carriers which are injected into the N epitaxial region must recombine before conduction in the device can be halted. Because the N epitaxial layer is lightly doped, particularly for high voltage devices, and relatively thick, the recombination time before the minority carriers are annihilated is long. This results in a long turn-off time for the IGBT.

Another disadvantage of the conventional IGBT structure is that the conductivity modulation effect is not noticeable until the PN junction formed by the N epitaxial and the P-type substrate becomes forward biased. Because little current flows in the IGBT before this PN junction is forward biased, low current conductivity is significantly lower than a conventional MOS device. Thus while the IGBT is superior for high current switching applications, it is inferior at low current switching or in applications where both low and high current switching are required.

A conventional MOS devices comprises an integral drain source diode which allows reverse current to flow through the device when the device is turned off. In many power switching applications such as totem pole and H-bridge motor switching circuits, the integral drain source diode is quite useful. Indeed, without the integral drain source diode an additional high current diode is required external to the device. Until now, however, the integral drain source diode of a conventional IGBT has been unavailable because the PN junction formed by the N-type epitaxial layer and the P-type substrate blocks the integral diode. Because of this, IGBTs required additional components which can more than double the cost of a comparable MOS device.

Accordingly, it is an object of the present invention is to provide an insulated gate bipolar transistor with enhanced low current conductivity.

Another object of the present invention is to provide an IGBT having reduced turn-off time and improved switching time.

A further object of the present invention is to provide an IGBT having a useable integral drain source diode.

A further object of the present invention is to provide a method of manufacturing the semiconductor substrate for use with an enhanced IGBT.

Still a further object of the present invention is to provide a method for manufacturing an enhanced IGBT.

SUMMARY OF THE INVENTION

These and other objects and advantages of the present invention are achieved by an IGBT structure formed on a multiple conductivity substrate. The multiple conductivity substrate comprises interspersed regions of N+ and P+ semiconductor material covered by an N-type layer in which the IGBT is formed. In a preferred embodiment, the N+ and P+ regions are arranged in a checkerboard mosaic pattern on a bottom side of the IGBT substrate. The P+ regions conductivity modulate the N-type epitaxial layer in which the IGBT structure is formed while the N+ regions improve low current conductivity, reduce minority carrier recombination time, and make an integral drain source diode accessible from the drain and source electrodes.

BRIEF DESCRIPTION OF THE DRAWINGS

FIG. 1 illustrates a cross-section of an enhanced insulated gate bipolar transistor (EIGBT) in accordance with the present invention;

FIGS. 2-3 illustrate cross-sectional views of a first method of making the EIGBT of FIG. 1;

FIGS. 4-6 illustrate cross-sectional views of a second method of making a semiconductor substrate for use with the EIGBT shown in FIG. 1;

DETAILED DESCRIPTION OF THE DRAWINGS

Figure 5:
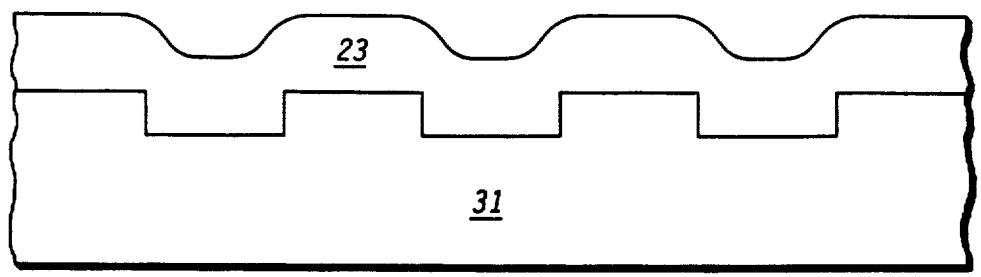

FIG. 1 illustrates a highly magnified cross-section of a portion of an enhanced insulated gate bipolar transistor (EIGBT) in accordance with the present invention. The cross-section shown in FIG. 1 is not to scale as some features are highly enlarged to show greater detail. N-type layer 11 has a top surface in which a conventional DMOS structure is formed. In the case of an N channel device, the DMOS structure includes a P-type region 14 and N-type source region 17 formed in the top surface of N-type layer 11. N-type layer 11 forms a drain of the DMOS transistor. Channel region 24 is formed in P-type region 14 between source diffusion 17 and drain region 11. Charge applied to gate electrode 16 inverts the conductivity of channel region 24 and allows current to flow from source region 17 to the drain formed by N-type layer 11. Source electrode 18 provides source current to source region 17.

A source-drain diode is formed at the junction between N-type layer 11 and P-type region 14. Source electrode 18 is coupled to P-type region 14 as well as N-type source region 17.

An important feature of the present invention are a plurality of P+ regions 12 and N+ regions 13 arranged on the bottom side of substrate 11. Low levels of forward current flow from source electrode 18 through source regions 17 and channel 24 through drain 11. Current exits through drain 11 through the plurality of N-type regions 13 so long as current remains at a low level. In this case the device functions similar to a conventional DMOS transistor as some level of current will flow at any applied drain source voltage. N+ regions 13 shunt minority carrier injection (MCI) diodes formed by the PN junctions between P+ regions 12 and N-type layer 11, resulting in improved low current performance compared to conventional IGBT structures which do not have N+ regions 13.

At higher current levels, a voltage gradient develops in N-type layer 11 due to resistive losses. The voltage gradient results in forward biasing of the MCI diodes formed by P+ regions 12 and N-type layer 11. The forward biased MCI diodes inject minority carriers into substrate 11 from P-type regions 12 thereby modulating conductivity of substrate 11. The minority carriers greatly reduce the resistivity of substrate 11 and therefore reduce power loss during forward conduction at high current levels.

During reverse bias, the source drain diode formed by P-type region 14 and N-type substrate 11 is usually unavailable in an IGBT. In an EIGBT in accordance with the present invention N+ regions 13 ohmically couple drain electrode 19 to substrate 11, shunting the MCI diodes. Unlike conventional IGBTs, the source drain diode of the EIGBT of the present invention is available during reverse conduction. From a user perspective the EIGBT has forward and reverse conduction characteristics of a conventional DMOS transistor, greatly simplifying circuit design.

FIG. 2 and FIG. 3 illustrate a first embodiment method of producing the EIGBT structure shown in FIG. 1. Substrate 21 comprises a semiconductor material, preferably silicon having a <100> crystal orientation, having a relatively low doping concentration. N-type pre-deposit 13' and P-type pre-deposit 12' are formed on the surface of substrate 21 using conventional ion deposition techniques. As shown in FIG. 3 the pre-deposit regions are diffused using conventional thermal diffusion techniques to form N-type regions 13 and P-type regions 12. Preferably regions 12 and 13 are approximately fifty to seventy microns deep.

Figure 6:
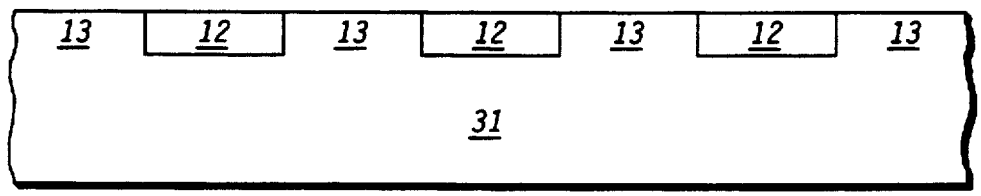

An alternative method for forming a structure similar to that shown in FIG. 3 is illustrated in FIGS. 4-6. Substrate 31, preferably <100> silicon, is heavily doped either N+ or P+. Cavities 22 are etched in substrate 31. Cavities 22 are preferably fifty to seventy microns deep. As shown in FIG. 5 an epitaxial layer of an opposite conductivity type from substrate 31 is formed filling cavities 22 and covering substrate 31. Epitaxial layer 23 is also heavily doped. Epitaxial layer 23 is planarized as shown in FIG. 6 to leave N-type regions 13 and P-type regions 12 formed in substrate 31.

Whether the first or second method is used, it is important that N-type regions 13 and P-type regions 12 are about fifty to seventy microns deep, although this thickness is not critical. The quality, thickness, and doping concentration of substrate 31 is not critical as most of this material will be removed later in processing.

Figure 7:
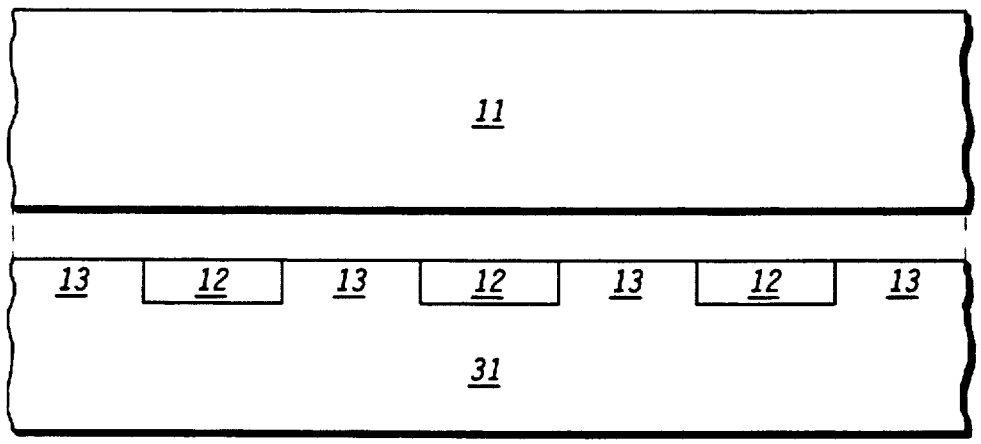
FIGS. 7-10 illustrate manufacturing steps and the equivalent circuit diagram for the EIGBT shown in FIG. 1.
Figure 8:
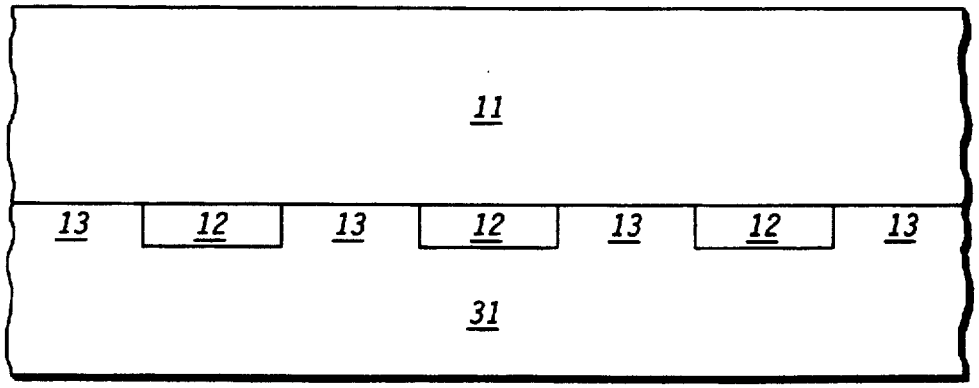

Preferably N-type layer 11 is attached by direct wafer bonding to the top surface of substrate 31 where regions 12 and 13 are exposed as shown in FIG. 7. Alternatively, a semiconductor layer 11 may be grown epitaxially on the top surface of substrate 31. Using either method of applying layer 11 to substrate 31, the structure shown in FIG. 8 results. The structure shown in FIG. 8 is a completed substrate. This intermediate product of the present invention can be stored, shipped, and used like a conventional semiconductor substrate.

Figure 9:
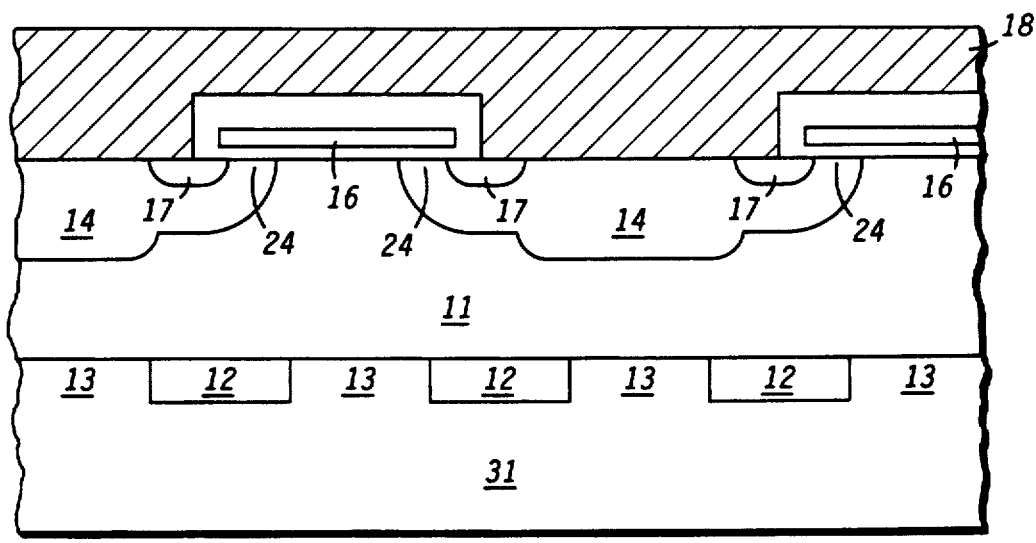

FIG. 9 shows an EIGBT in accordance with the present invention further along in processing. All of the DMOS structures formed in the top surface of substrate 11 have been formed including gate electrode 16 and source metallization 18. Through all of this processing substrate 31 is bonded to substrate 11. As substrate 11 is preferably 100-150 microns thick, substrate 13 provides needed mechanical support during the DMOS processing steps.

Once the source metallization is complete the bottom surface of substrate 31 is removed by conventional polishing or grinding techniques. The bottom surface of substrate 31 is polished back so that N-type regions 13 and P-type regions 12 are exposed at the bottom surface. Because regions 12 and 13 are relatively thick (fifty to seventy microns) this polish step is not critical or difficult. The final thickness of regions 12 and 13 is not important so long as the regions are exposed at the bottom surface and are dispersed substantially evenly across the bottom side of substrate 11. Referring again to FIG. 1, the structure is completed by application of back or drain metallization 19. Drain metal 19 shorts regions 12 and 13 together, providing both an ohmic path through regions 13 and a rectifying path through regions 12 to substrate 11.

As described above, these parallel ohmic and rectifying paths are coupled so that the rectifying path is shunted by N+ regions 13 at low currents and during reverse bias of the EIGBT. At high currents, however, the rectifying path through P-type regions 12 becomes forward biased, injecting minority carriers into substrate 11 and conductivity modulating substrate 11.

Another important advantage of the EIGBT structure shown in FIG. 1 is that reverse recovery time, which is the time required to remove minority carriers from substrate 11 when the device is turned off is believed to be somewhat improved. The plurality of regions 12 and 13 spread throughout the bottom surface of substrate 11 provide a very large surface area for carrier recombination. Thus, the rectifying and non-rectifying contact not only provide advantages in supplying a forward current, but also increase switching speed and maximum frequency at which the EIGBT can be used.

Figure 10:
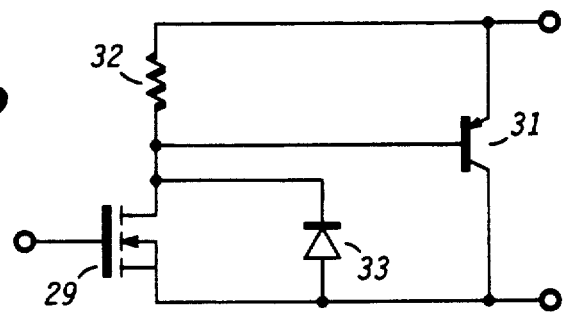

FIG. 10 shows an equivalent circuit diagram for the EIGBT shown in FIG. 1. The circuit shown in FIG. 10 could be realized with discrete components at much greater expense than the integrated embodiment shown in FIG. 1. The EIGBT comprises an N channel DMOS transistor 29 having a gate, a drain, and a source, and a PNP bipolar transistor 31 having a collector, a base, and an emitter. The drain is coupled to the base to the collector through drain resistance 32 to form a drain terminal of the EIGBT. The drain resistance represents resistance of N-type layer 11 shown in FIG. 1. The source is coupled to the collector to form a source terminal of the EIGBT. The gate of the DMOS transistor forms a gate terminal of the EIGBT.

Figure 11:
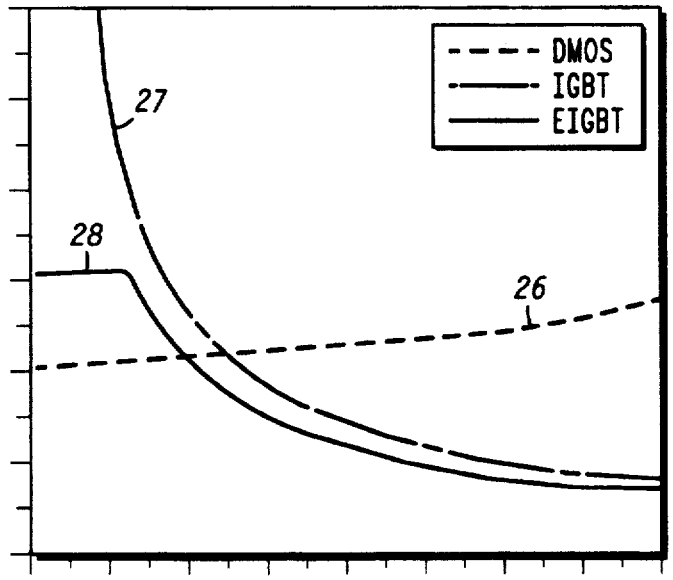
FIG. 11 illustrates conduction characteristics of the EIGBT compared to conventional IGBT and DMOS technologies.

FIG. 11 illustrates computer modeled performance of the EIGBT of the present invention compared against conventional DMOS and conventional IGBT structures. The vertical axis shows relative on resistance (rds(on)) while the horizontal axis shows current through the device. Line 26 illustrates performance of a conventional high voltage DMOS transistor and line 27 illustrates performance of a conventional IGBT having a similar breakdown voltage and die size. The well known relationship between DMOS transistors and IGBT is apparent. At low currents the IGBT has relatively high rds(on) due to the blocking action of the minority carrier injection diode. Conventional DMOS transistor, however, has a relatively constant rds(on) which increases gradually at higher currents. The IGBT rds(on) drops drastically at higher currents due to the minority carrier injection effects once the MCI diode becomes forward biased showing a great improvement in rds(on) compared to the conventional DMOS transistor.

The EIGBT of the present invention provides somewhat higher rds(on) than a conventional DMOS transistor in a low current regime. The low current blocking effects of the minority carrier injection diode are greatly reduced, however, as compared to the conventional IGBT. At relatively low forward current, however, the effects of minority carrier injection are apparent and rds(on) of the EIGBT drops rapidly. The EIGBT rds(on) falls below both the conventional IGBT and conventional DMOS transistor at moderate current values. The EIGBT of the present invention, therefore, has greatly improved rds(on) in both the low current and high current regimes and so makes a more usable general purpose switching transistor.

By now it should be apparent that an enhanced insulated gate bipolar transistor has been provided having a plurality of N-type and P-type regions formed on the back side between a drain electrode and a substrate in which the IGBT structure is formed. The P-type and N-type regions are preferably arranged in a checkerboard mosaic pattern covering the entire back side of the IGBT device. The combination of N-type and P-type regions provides improved low current and high current performance while improving operating frequency over conventional IGBT structures.

We claim:

1. A method for manufacturing an enhanced insulated gate bipolar transistor (EIGBT) comprising: providing a first <100> semiconductor substrate of a first conductivity type having a top and a bottom surface; forming a plurality of first conductivity type regions in the first substrate; forming a plurality of second conductivity type regions in the first substrate, wherein the first and second conductivity type regions are arranged in a checkerboard mosaic pattern; forming a single crystal semiconductor layer having a bottom surface laminated to the top surface of the first substrate and a top surface which is exposed; forming a filed effect transistor having gate and source electrodes in the exposed top surface; polishing the bottom side of the first substrate to expose the plurality of first and second conductivity type regions; and forming a drain electrode on the bottom surface of the first substrate coupled to both the plurality of first conductivity type regions and the plurality of second conductivity type regions.

2. The method of claim 1 wherein the step of forming a plurality of second conductivity type regions further comprises the steps of: providing an etch resistant mask layer on the top side of the first substrate; forming the checkerboard mosaic pattern in the mask layer; etching the top side of the first substrate through the mask layer to form a plurality of holes of a predetermined depth; refilling the holes by epitaxially depositing semiconductor material of a second conductivity type; and polishing the top side of the first substrate to expose the epitaxially depositing semiconductor material.

3. The method of claim 1 wherein the step of forming a plurality of first and second conductivity type regions further comprises the steps of: pre-depositing N-type and P-type dopant atoms on the top surface of the first substrate in the checkerboard mosaic pattern; and simultaneously diffusing both types of dopant atoms to a predetermined depth.

4. The method of claim 1 wherein the step of forming a single crystal semiconductor layer having a bottom surface laminated to the top surface of the first substrate and a top surface which is exposed comprises epitaxially depositing the semiconductor layer.

5. The method of claim 1 wherein the step of forming a single crystal semiconductor layer having a bottom surface laminated to the top surface of the first substrate and a top surface which is exposed comprises bonding a second semiconductor substrate to the top surface of the first semiconductor substrate.

6. The method of claim 2 or 3 wherein the predetermined depth is approximately fifty to seventy five microns.

* * * * *

UNITED STATES PATENT AND TRADEMARK OFFICE
CERTIFICATE OF CORRECTION

PATENT NO. : 5,141,889
DATED : August 25, 1992
INVENTOR(S) : Lewis E. Terry et al.

It is certified that error appears in the above-indentified patent and that said Letters Patent is hereby corrected as shown below:

Claim 1, column 6, line 15, "filed" should read --field--.

Signed and Sealed this

Fourteenth Day of March, 1995

*Attest:*

BRUCE LEHMAN

*Attesting Officer*   *Commissioner of Patents and Trademarks*